United States Patent
Umeda

[19]

[11] Patent Number: 6,118,294
[45] Date of Patent: Sep. 12, 2000

[54] INTEGRATED CIRCUIT TESTING DEVICE

[75] Inventor: Yoshiyuki Umeda, Tokyo, Japan

[73] Assignee: Ando Electric Co., Ltd., Tokyo, Japan

[21] Appl. No.: 09/035,459

[22] Filed: Mar. 5, 1998

[30] Foreign Application Priority Data

Mar. 6, 1997 [JP] Japan .................................. 9-052059

[51] Int. Cl.[7] ...................... G01R 31/26; G01R 31/3183
[52] U.S. Cl. ............................................ 324/765; 324/537
[58] Field of Search ................................... 324/522, 523, 324/527, 537, 765, 158.1

[56] References Cited

U.S. PATENT DOCUMENTS 5,146,161  9/1992  Kiser ........................................ 324/763
5,241,364  8/1993  Nishiura ................................. 324/158.1
5,590,137  12/1996  Yamashita ........................ 324/158.1 X Primary Examiner—Glenn W. Brown
Attorney, Agent, or Firm—Fish & Richardson P.C.

[57] ABSTRACT

The invention is an integrated circuit testing device for testing whether a plurality of unknown data stored in a device under test are identical. A test pattern generated by a pattern generator 1 is supplied to a device under test 5 through drivers 3, as a result of which unknown data 5-1 obtained from the device under test 5 are sent through a comparator 4 and a judgment circuit 6 to be stored in an expected value memory 7 as a dummy expected value pattern. Thereafter, further unknown data 5-2, 5-3, . . . are sequentially read from the device under test 5 to collate them with the unknown data 5-1 in the expected value memory 7 by means of the judgment circuit 6.

8 Claims, 4 Drawing Sheets

INTEGRATED CIRCUIT TESTING DEVICE

BACKGROUND OF THE INVENTION

1. Field of the Invention

The present invention relates to an integrated circuit testing device for testing the functions and electrical properties of semiconductor integrated circuits.

The present application is based on Patent Application No. Hei 9-52059 filed in Japan, the content of which is incorporated herein by reference.

2. Conventional Art

FIG. 4 is a block diagram showing the structure of a conventional integrated circuit testing device. In this drawing, the pattern generator 1 is a device for sequentially generating input test patterns in time series and expected value patterns corresponding thereto.

The control circuit 2 is a means for selecting either the driver 3 or the comparator 4 for each pin in the device under test 5. That is, the integrated circuit testing device has multiple pairs of drivers 3 and comparators 4 (in order to prevent the drawing from becoming too confusing, FIG. 4 shows only the driver 3 and comparator 4 corresponding to a single pin), and each pin of the device under test 5 is connected to a pair. The control circuit 2 selects and connects a driver 3 to each pin which is an input terminal of the device under test 5, and selects and connects a comparator 4 to each pin which is an output terminal.

Under selection control due to this control circuit 2, the selected drivers 3 supply input test patterns generated by the pattern generator 1 as input signals to the pins (input terminals) of the device under test 5. Additionally, the selected comparators 4 form the output signals obtained from the pins (output terminals) of the device under test 5 into digital signals by comparing them with standard levels determined by a device test program.

A judgment circuit 6 compares the binary data obtained from the comparators 4, i.e. the binary time series pattern of the output signals from the device under test 5, with the above-mentioned expected value pattern, and judges whether or not the device under test 5 is functioning normally.

If, for example, the device under test 5 is a RAM, this integrated circuit testing device can perform function tests in the following manner. First, data A is generated by the pattern generator 1 as an input test pattern, and this data A is written into the device under test 5 through the drivers 3. Subsequently, an input test pattern for reading memory data from the device under test 5 and an expected value pattern which is identical to the above-mentioned data A are generated by the pattern generator 1. Then, the input pattern is introduced to the device under test 5 through the drivers 3, as a result of which the signals output from the device under test 5 (i.e. the memory data) are formed into a binary signal by the comparator 4 and sent to the judgment circuit 6, at which time it is compared with the data A which is generated as an expected value pattern. In this comparison, the memory operations of the device under test 5 are normal if the binary data received from the comparators 4 match the data A which is the expected value pattern, and if there is no match, then there is an abnormality in the memory operations of the device under test 5.

With the conventional integrated circuit testing devices as explained above, it is possible to perform logic function tests of various semiconductor integrated circuits if an input test pattern and an expected value pattern are prepared for each function of the device under test.

However, when performing tests of semiconductor integrated circuits, the expected value patterns are not necessarily always capable of being prepared, and at times judgments must be made of the devices under test without the expected value patterns.

For example, when the device under test is a memory element and the content of the memory is unknown, then a test must be performed on the unknown data stored in the device under test.

As one type of test for unknown data, there is a test for a case wherein the same unknown data are stored in a plurality of locations in a single device under test, wherein it is judged whether or not the unknown data are truly identical.

Additionally, as another type of test for unknown data, there is a test for a case wherein the same unknown data are stored in a plurality of devices under test (the unknown data stored in each of the devices under test can be either single or plural), wherein it is judged whether or not the unknown data are identical.

Since this type of conventional integrated circuit testing device cannot collate the unknown data when the device under test stores unknown data, it cannot perform such tests of unknown data.

SUMMARY OF THE INVENTION

The present invention has been made in view of these considerations, and has the object of offering an integrated circuit testing device capable of performing tests on unknown data when unknown data are stored in the devices under test.

In order to achieve the above-mentioned object, the present invention offers an integrated circuit testing device, comprising a driver for supplying a device under test with a test pattern as an input signal; an expected value memory for storing as a dummy expected value pattern an output signal output from said device under test when supplied by said input signal; and a judgment circuit for comparing an output signal output from said device under test when supplied by said input signal with the dummy expected value pattern.

Additionally, the present invention offers an integrated circuit testing device, comprising a driver for supplying a device under test with a test pattern as an input signal; an expected value memory for storing as a dummy expected value pattern an output signal output from said device under test when supplied by said input signal; a switching circuit for selecting and outputting either said test pattern or the dummy expected value pattern stored in said expected value memory; and a judgment circuit for comparing an output signal output from said device under test when supplied by said input signal with the dummy expected value pattern.

According to the present invention as described above, it is possible to test whether a plurality of unknown data stored in a device under test is identical. Additionally, when there are a plurality of devices under test storing prestored unknown data, it is possible to examine whether the unknown data stored in each device under test is the same. Furthermore, by forming groups of expected value data, it is also possible to test devices under test storing different known data.

DESCRIPTION OF PREFERRED EMBODIMENTS

Hereinbelow, embodiments of the present invention shall be explained with reference to the drawings.

A. First Embodiment

Figure 1:
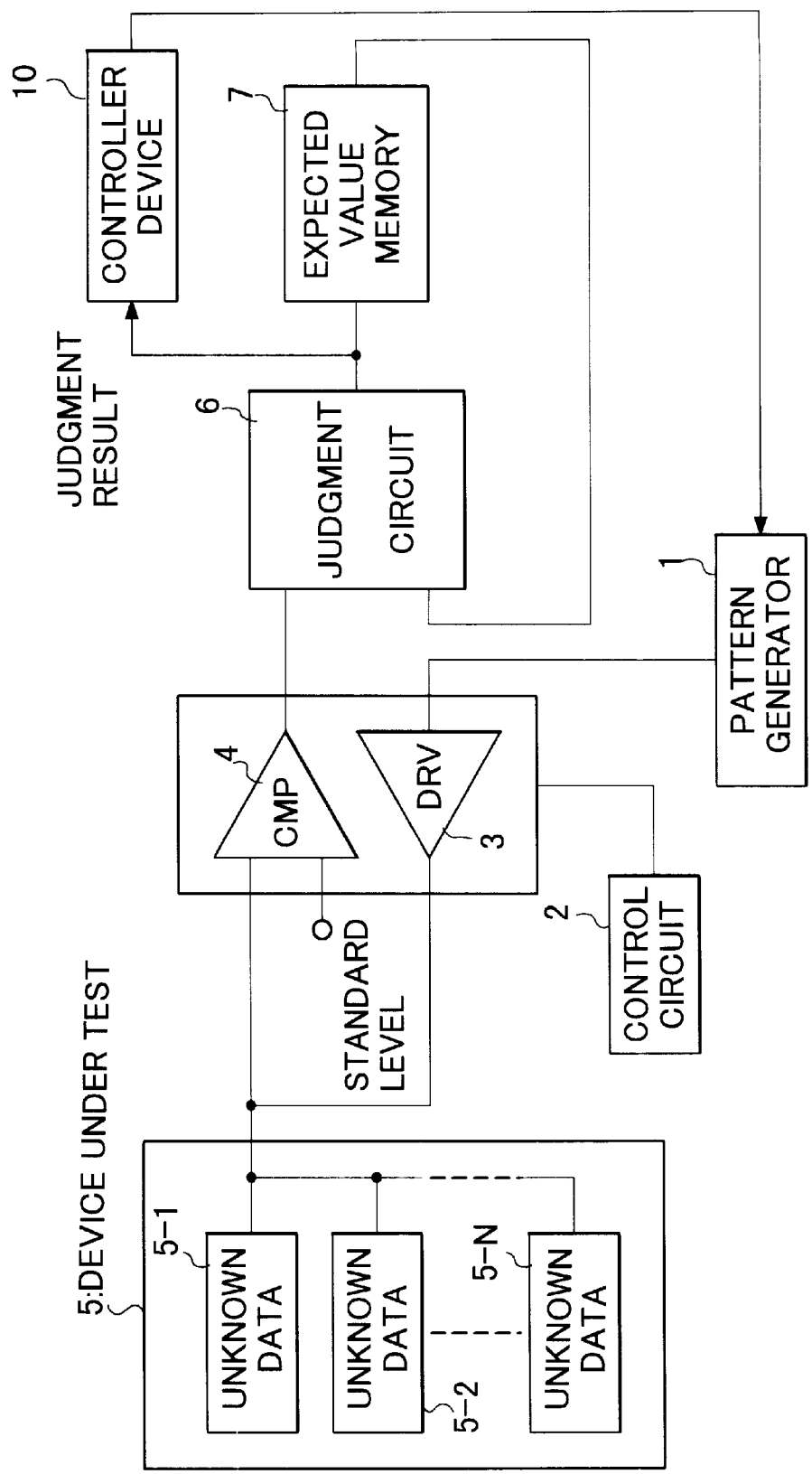
FIG. 1 is a block diagram showing the structure of an integrated circuit testing device according to a first embodiment of the present invention.
Figure 4:
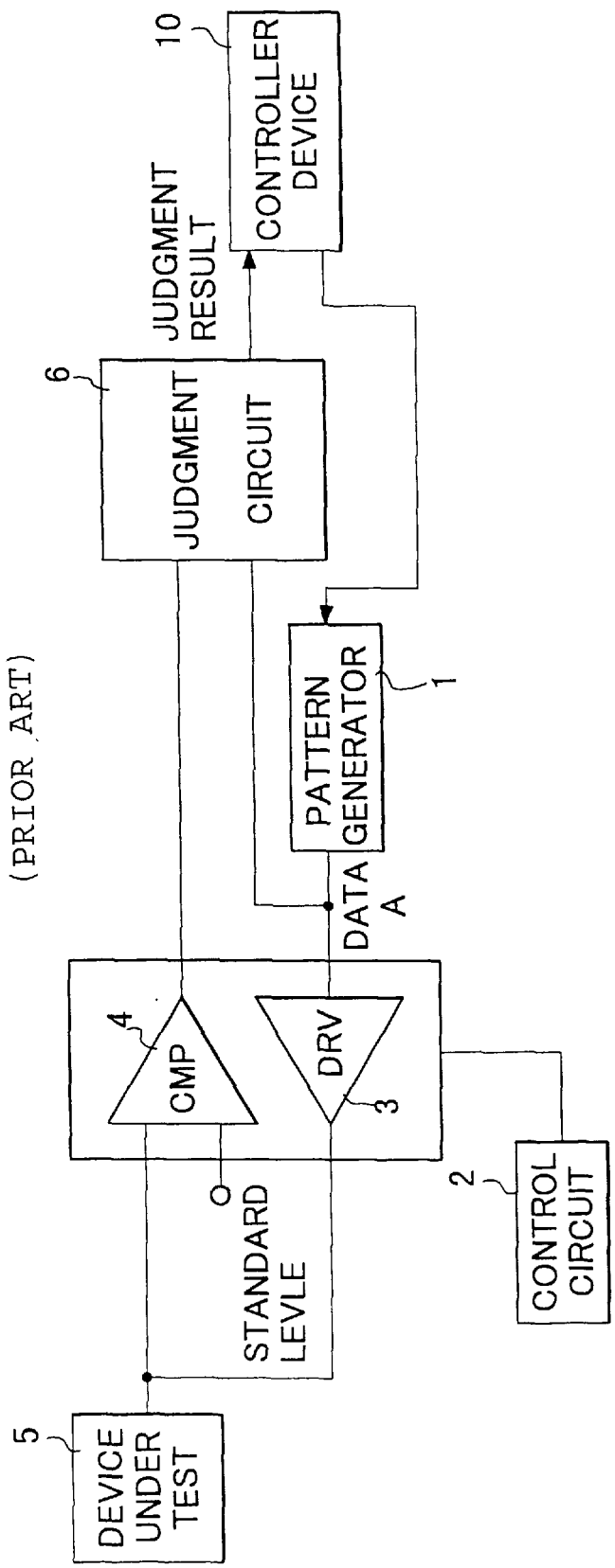
FIG. 4 is a block diagram showing the structure of a conventional integrated circuit testing device.

FIG. 1 is a block diagram showing the structure of an integrated circuit testing device according to a first embodiment of the present invention. In this drawing, the portions which correspond to the above-described FIG. 4 are denoted by the same reference numbers, and their explanations are omitted.

When the device under test 5 stores unknown data 5-1 to 5-N, the integrated circuit testing device according to this embodiment is capable of judging whether or not the unknown data are identical. In order to achieve this new function, the integrated circuit testing device according to this embodiment is additionally provided with an expected value memory 7. Here, the expected value memory 7 is a means for storing unknown data read from the device under test 5 as a dummy expected value pattern for the purposes of comparison with other unknown data.

Below, the operations of the present embodiment shall be explained. First, the content of the memory in the expected value memory 7 is deleted at the start of the test. Next, the unknown data 5-1 stored in the device under test 5 is read by supplying an input test pattern from the pattern generator 1, and this unknown data 5-1 is sent through the comparator 4 to the judgment circuit 6.

This judgment circuit 6 is a circuit which outputs a low level when the data supplied from the comparator 4 is of the same level as the output data of the expected value memory 7, and outputs a high level when they are different. Here, all of the bits of the output data are at low level because it is immediately after the memory contents of the expected value memory 7 have been deleted. Therefore, at this point, the unknown data 5-1 is output from the judgment circuit 6, and stored in the expected value memory 7.

Next, the unknown data 5-2 is read from the device under test 5 by supplying an input test pattern, and is sent to the judgment circuit 6. At this time, the unknown data 5-1 is read from the expected value memory 7, and sent to the judgment circuit 6. As a result, the judgment circuit 6 judges whether or not the unknown data 5-1 and the unknown data 5-2 are identical.

Thereafter, each of the unknown data up to 5-N are compared with the unknown data 5-1 stored in the expected value memory 7. Additionally, the same operation is performed when there are a plurality of devices under test.

B. Second Embodiment

Figure 2:
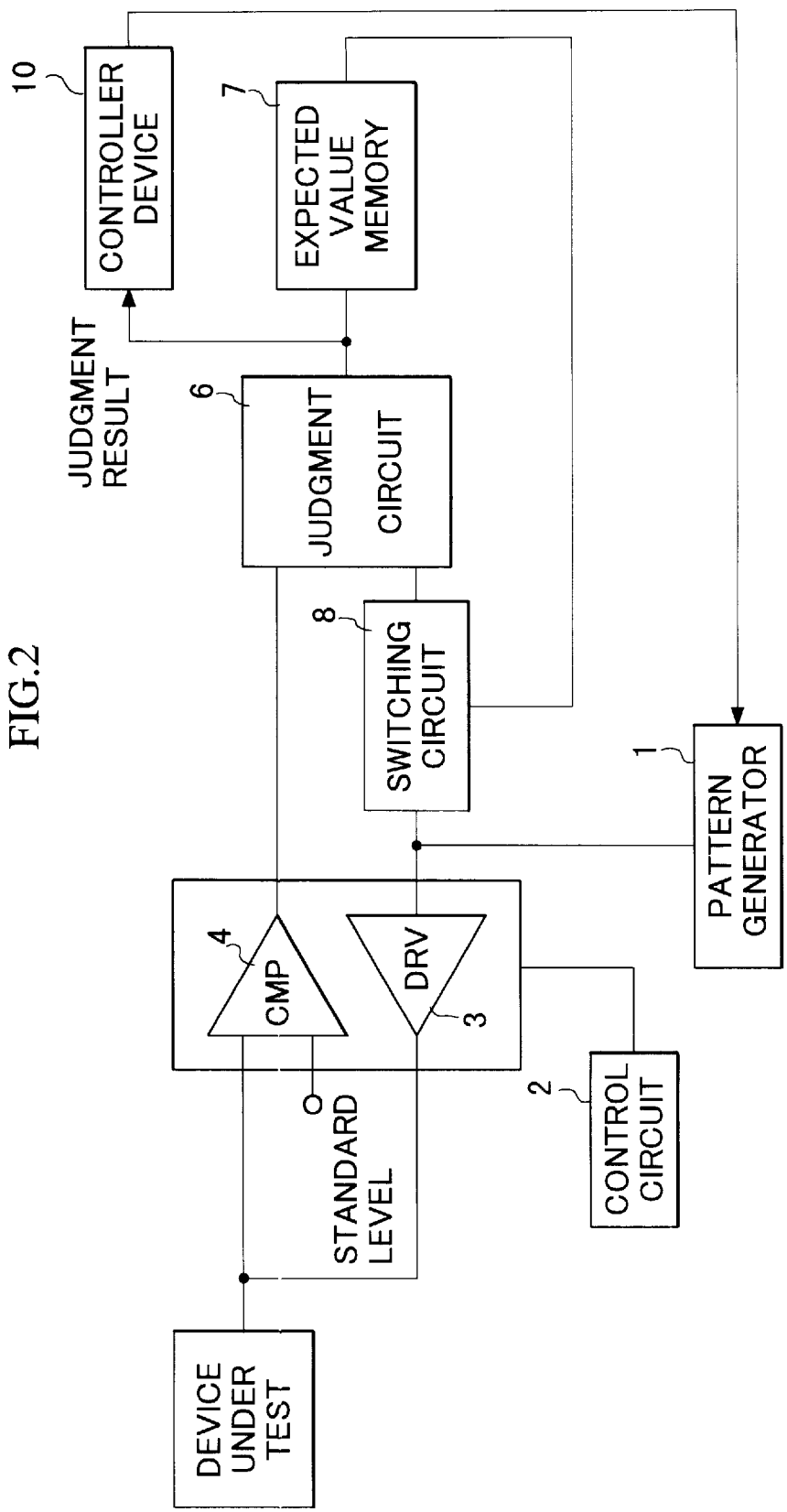
FIG. 2 is a block diagram showing the structure of an integrated circuit testing device according to a second embodiment of the present invention.

FIG. 2 is a block diagram showing the structure of an integrated circuit testing device according to a second embodiment of the present invention. In this drawing, the parts which are identical to those in the above-described FIG. 1 are denoted by the same reference numbers, and their explanations are omitted.

The integrated circuit testing device according to the present embodiment enables both comparisons between unknown data and conventional tests using expected value patterns. In the present embodiment, a switching circuit 8 is added in order to switch between these two types of testing. This switching circuit 8 switches between test patterns output from the pattern generator 1 or dummy expected value patterns output from the expected value memory 7 to supply to the judgment circuit 6.

In order to perform comparisons between unknown data in the present embodiment, the expected value memory 7 is selected by the switching circuit 8. As a result, it is possible to perform exactly the same operations as in the above-mentioned first embodiment.

On the other hand, in order to perform conventional tests for comparing the output signals of the device under test 5 with the expected value pattern, the switching circuit 8 is switched to the pattern generator 1. By so doing, data A is generated by the pattern generator 1, and while this data A is sent through the drivers 3 and written into the device under test, it can be sent through the switching circuit 8 and the judgment circuit 6 to be written into the expected value memory 7. Then, the data A written into the device under test 5 in this way is read out and supplied to the judgment circuit 6. At this time, it is possible to judge whether or not the data A has been properly written into the device under test 5 by supplying the data A written into the expected value memory 7 to the judgment circuit 6.

C. Third Embodiment

Figure 3:
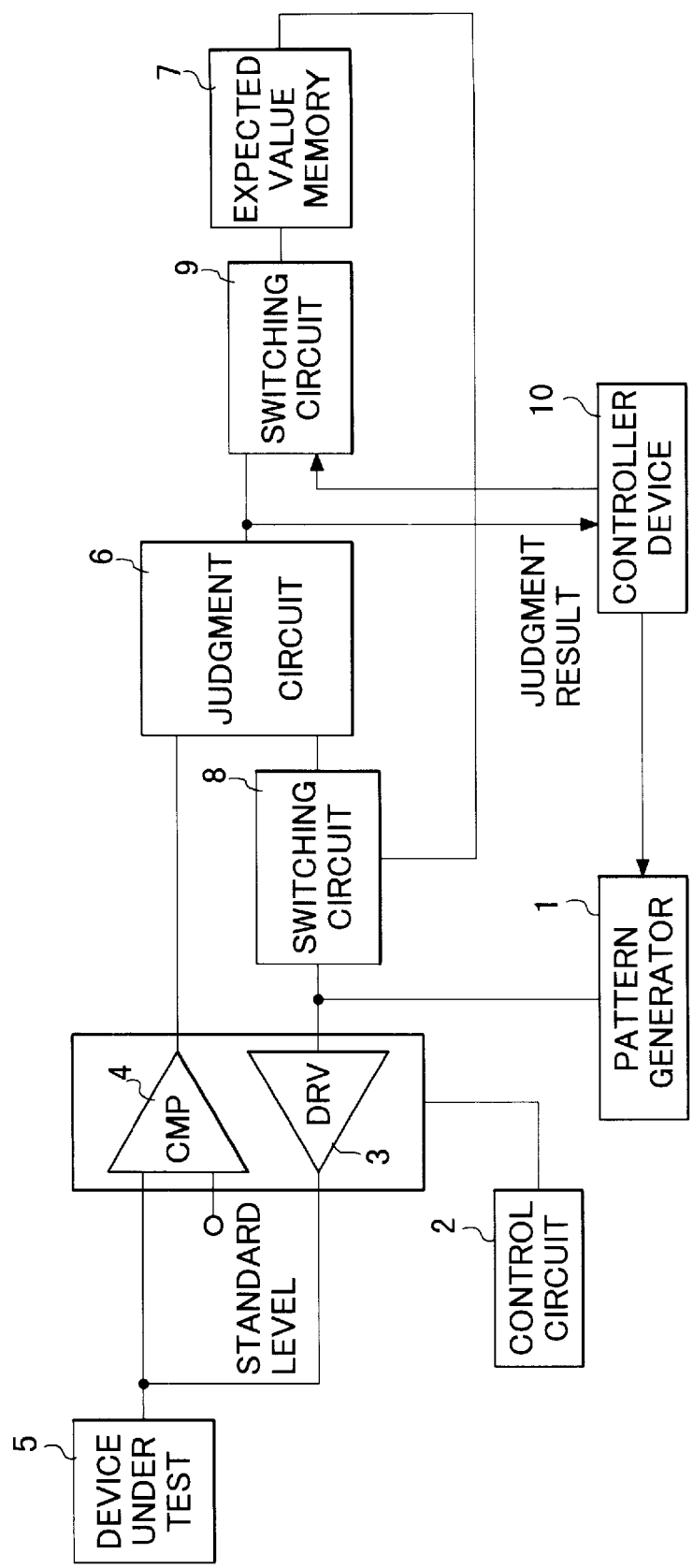
FIG. 3 is a block diagram showing the structure of an integrated circuit testing device according to a third embodiment of the present invention.

FIG. 3 is a block diagram showing the structure of an integrated circuit testing device according to a third embodiment of the present invention. The parts which correspond to parts of the above-described FIG. 2 are denoted by the same reference numbers, and their explanations shall be omitted.

The present embodiment has a switching circuit 9 between the judgment circuit 6 and the expected value memory 7, so that the controller device 10 can write data directly into the expected value memory 7 through this switching circuit 9.

According to the present embodiment, when the expected value pattern is different according to the device under test 5, the expected value patterns can be sequentially used by the controller device 10, so as to perform tests on all of the devices under test 5.

The invention claimed is:

1. An integrated circuit testing device, comprising:
    a driver for supplying a device under test with a test pattern as an input signal;
    an expected value memory for storing as a dummy expected value pattern a first output signal read from said device under test in response to an input signal from the driver; and a judgment circuit for comparing a second output signal with the dummy expected value pattern, wherein the second output signal is read from the device under test in response to an input signal from the driver.

2. An integrated circuit testing device in accordance with claim 1, further comprising a pattern generator for generating a test pattern used as the input signals of said device under test.

3. An integrated circuit testing device in accordance with claim 1, wherein the content stored in said expected value memory is deleted when testing of said device under test is started.

4. An integrated circuit testing device, comprising:
- a driver for supplying a device under test with a test pattern as an input signal;
- an expected value memory for storing as a dummy expected value pattern a first output signal read from said device under test in response to an input signal from the driver;
- a switching circuit for selecting and outputting either said test pattern or the dummy expected value pattern stored in said expected value memory; and
- a judgement circuit for comparing a second output signal with the test pattern or the dummy expected value pattern selected by said switching circuit, wherein the second output signal is read from the device under test in response to an input signal from the driver.

5. An integrated circuit testing device in accordance with claim 4, further comprising a pattern generator for generating a test pattern used as the input signals of said device under test.

6. An integrated circuit testing device in accordance with claim 4, further comprising means for writing data into said expected value memory.

7. An integrated circuit testing device in accordance with claim 4, wherein the content stored in said expected value memory is deleted when the testing of said device under test is started.

8. An integrated circuit testing device in accordance with claim 7, further comprising means for writing data into said expected value memory.

* * * * *